United States Patent
Jung et al.

(10) Patent No.: US 8,754,404 B2
(45) Date of Patent: Jun. 17, 2014

(54) ORGANIC LIGHT EMITTING DIODE DISPLAY

(75) Inventors: Woo-Suk Jung, Yongin (KR); Hee-Seong Jeong, Yongin (KR); Soon-Ryong Park, Yongin (KR); Eun-Ah Kim, Yongin (KR); Hee-Chul Jeon, Yongin (KR); Chul-Woo Jeong, Yongin (KR); Joo-Hwa Lee, Yongin (KR); Noh-Min Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 569 days.

(21) Appl. No.: 12/651,011

(22) Filed: Dec. 31, 2009

(65) Prior Publication Data

US 2010/0171107 A1 Jul. 8, 2010

(30) Foreign Application Priority Data

Jan. 7, 2009 (KR) ........................ 10-2009-0001164

(51) Int. Cl.
*H01L 29/08* (2006.01)

(52) U.S. Cl.
USPC .......................................................... 257/40

(58) Field of Classification Search
CPC ..... H01L 27/12; H01L 27/32; H01L 27/1214; H01L 27/3206; H01L 27/3211; H01L 27/322; H01L 27/3276; H01L 27/3279; H01L 27/3288; H01L 27/329; H01L 27/3295; H01L 27/3246; H01L 51/5231; H01L 51/5281; H01L 51/85; H01L 51/8537; H01L 51/525; H01L 51/5284
USPC .......................................................... 257/40
See application file for complete search history.

(56) References Cited

U.S. PATENT DOCUMENTS

| | | | |
|---|---|---|---|
| 2005/0174045 A1* | 8/2005 | Lee et al. ................... | 313/504 |
| 2007/0108899 A1* | 5/2007 | Jung et al. .................. | 313/506 |
| 2007/0188088 A1* | 8/2007 | Suzuki ........................ | 313/506 |
| 2007/0194322 A1* | 8/2007 | Sung et al. .................. | 257/72 |
| 2008/0042146 A1* | 2/2008 | Cok et al. ................... | 257/79 |
| 2008/0048557 A1 | 2/2008 | Birnstock et al. | |
| 2009/0039773 A1 | 2/2009 | Jun et al. | |
| 2009/0068453 A1 | 3/2009 | Chung | |
| 2009/0115688 A1* | 5/2009 | Adachi et al. .............. | 345/32 |

FOREIGN PATENT DOCUMENTS

| | | |
|---|---|---|
| KR | 10-2004-0049141 | 6/2004 |
| KR | 10-2005-0030296 | 3/2005 |
| KR | 10-2007-0055908 | 5/2007 |
| KR | 10-0793546 | 1/2008 |
| KR | 10-0838090 | 6/2008 |

OTHER PUBLICATIONS

U.S. Appl. No. 12/650,999, filed Dec. 31, 2009, Woo-Suk Jung et al., Samsung Mobile Display Co., Ltd.
U.S. Office action dated Jan. 24, 2012, for cross reference U.S. Appl. No. 12/650,999, (17 pages).

* cited by examiner

*Primary Examiner* — Shaun Campbell
(74) *Attorney, Agent, or Firm* — Christie, Parker & Hale, LLP

(57) ABSTRACT

An organic light emitting diode display including: a substrate; pixel electrodes formed on the substrate; a pixel defining layer having openings exposing the plurality of pixel electrodes, formed on the substrate; spacers formed on the pixel defining layer; organic emission layers formed on the pixel electrodes; a common electrode formed on the organic emission layers; and color filters formed on the common electrode, in the openings of the pixel defining layer.

19 Claims, 3 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2009-0001164, filed in the Korean Intellectual Property Office on Jan. 7, 2009, the disclosure of which is incorporated herein, by reference.

BACKGROUND OF THE INVENTION

1. Field of the Invention

Aspects of the present invention relate to an organic light emitting diode (OLED) display having improved visibility.

2. Description of the Related Art

An organic light emitting diode display includes a plurality of organic light emitting diodes that include hole injection electrodes, organic emission layers, and electron injection electrodes. Light is produced when excitons, generated by combination of holes and electrons in the organic emission layer, transit from an excited state to a ground state. The light is then used to form an image.

An organic light emitting diode display has self-emitting characteristics and therefore, does not require an additional light source. Therefore, an organic light emitting diode display can be thinner and lighter than a liquid crystal display, which includes such an additional light source. Further, since organic light emitting diode displays have a low power consumption, a high luminance, and a high reaction speed, they have attracted considerable attention as next-generation displays for portable electronic apparatuses.

In general, the hole injection electrodes, the electron injection electrodes, and various other metal wires that are disposed in the organic light emitting diode display can reflect ambient light. When an organic light emitting diode display is used in a bright environment, contrast and black levels are reduced, due to the ambient light reflection, resulting in reduced image visibility.

The above information is disclosed only to enhance the understanding of the background of the invention, and therefore, it may contain information that does not constitute prior art.

SUMMARY OF THE INVENTION

Aspects of the present invention provide an organic light emitting diode display that has improved visibility.

An exemplary embodiment of the present invention provides an organic light emitting diode display that includes: a substrate; a plurality of pixel electrodes formed on the substrate; a pixel defining layer having openings exposing a plurality of pixel electrodes, formed on the substrate; a plurality of spacers that protrude from the pixel defining layer; organic emission layers formed on the pixel electrodes; a common electrode formed on the organic emission layers; and a plurality of color filters formed on the common electrode, in the openings of the pixel defining layer.

According to some embodiments, each organic emission layer may emit the same color of light as the color filter positioned thereon.

According to some embodiments, some of the organic emission layers may emit white light.

According to some embodiments, the spacers may have at least one portion that is shaped as a truncated pyramid, a prism, a truncated circular cone, a cylinder, a hemisphere, and a semi-oblate sphere. The organic light emitting diode display further includes a sealing member disposed opposite to the substrate, with the spacers interposed therebetween. The spacers may maintain a space between the substrate and the sealing member.

According to some embodiments, the spacers and the pixel defining layer may be integrally formed, using the same material and the same process.

According to some embodiments, the common electrode has a laminate structure formed of a first metal layer and a second metal layer. Each of the first metal layer and the second metal layer may include a metal independently selected from magnesium (Mg), silver (Ag), calcium (Ca), lithium (Li), chromium (Cr), and aluminum (Al).

According to some embodiments, the first metal layer may include silver (Ag), and the second metal layer may include at least one of an alloy of magnesium and silver (Mg:Ag), aluminum (Al), calcium (Ca), lithium (Li), and chromium (Cr).

Accordingly, aspects of the present invention provide an organic light emitting diode display having improved visibility and contrast, which minimizes the loss of light emitted from the organic light emitting elements.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
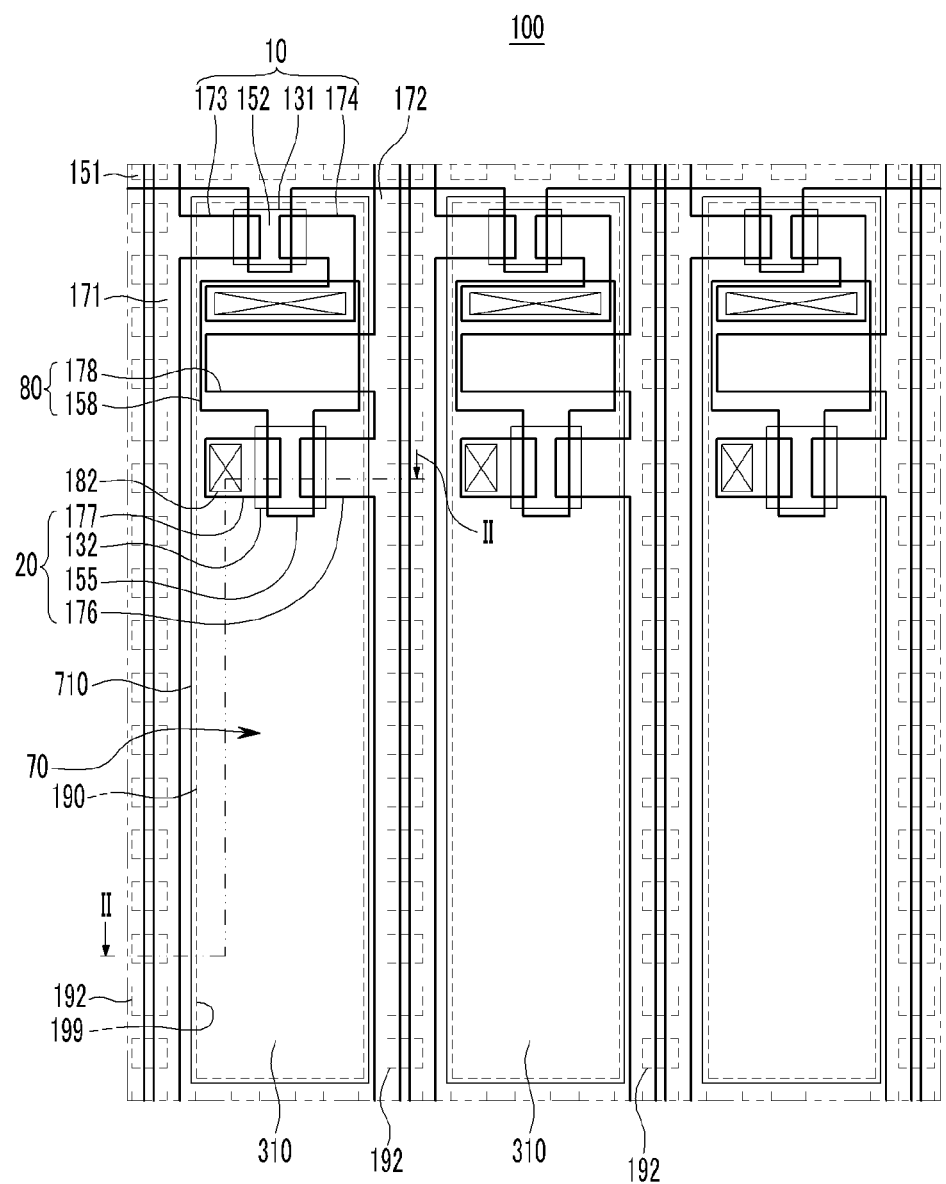
FIG. 1 is a plan view of an organic light emitting diode display, according to a first exemplary embodiment of the present invention.

Reference will now be made in detail to the exemplary embodiments of the present invention, examples of which are illustrated in the accompanying drawings, wherein like reference numerals refer to like elements throughout. The exemplary embodiments are described below, in order to explain the aspects of the present invention, by referring to the figures. Since sizes and thicknesses of constituent members shown in the accompanying drawings are arbitrarily given, for better understanding and ease of description, the present invention is not limited to the illustrated sizes and thicknesses.

In the drawings, the thickness of layers, films, panels, regions, etc., are exaggerated for clarity. In the drawings, the thickness of layers, films, panels, regions, etc., are exaggerated for convenience of description. It will be understood that when an element such as a layer, film, region, or substrate is referred to as being formed or disposed "on" another element, it can be directly on the other element, or intervening elements may also be present. In contrast, when an element is referred to as being formed or disposed "directly on" another element, there are no intervening elements present.

In the accompanying drawings, although an active matrix (AM) type organic light emitting diode display, having a 2Tr-1Cap structure that is provided with two thin film transistors (TFTs) and one storage capacitor in one pixel, is shown, the present invention is not limited thereto. Accordingly, the organic light emitting diode display may be provided with three or more thin film transistors and two or more storage capacitors, in one pixel, and may be configured to have various structures with additional wires. Herein, a pixel represents a minimum unit of an image, and the organic light emitting diode display displays an image using a plurality of pixels.

Figure 2:
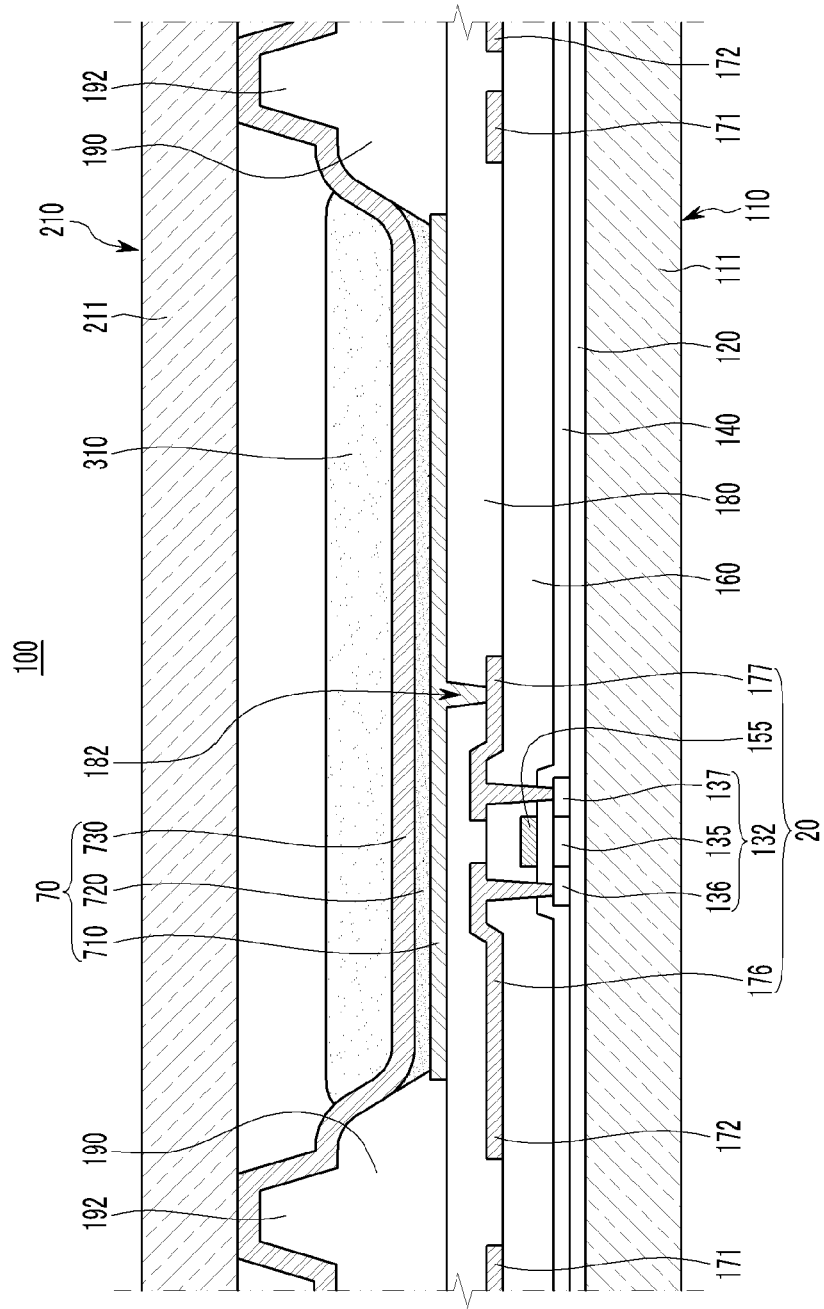
FIG. 2 is a cross-sectional view taken along the line II-II of FIG. 1.

FIGS. 1 and 2 illustrate an organic light emitting diode display 100, according to a first exemplary embodiment of the present invention. As shown in FIGS. 1 and 2, the organic light emitting diode display 100 includes a display substrate 110 and a sealing member 210. FIG. 1 is a plan view illustrating the structure of a pixel disposed on the display substrate 110. FIG. 2 is a cross-sectional view illustrating both the display substrate 110 and the sealing member 210, taken along the line II-II of FIG. 1.

The display substrate 110 includes a switching thin film transistor 10, a driving thin film transistor 20, a storage capacitor 80, and an organic light emitting diode (OLED) 70, which are formed in each pixel. Further, the display substrate 110 includes a first substrate member 111, a gate line 151 disposed in one direction, a data line 171 that crosses and is insulated from the gate line 151, and a common power supply line 172. Herein, a boundary of one pixel may be defined by the gate line 151, the data line 171, and the common power supply line 172, but the present invention is not limited thereto.

Each organic light emitting element 70 includes a pixel electrode 710, an organic emission layer 720 formed on the pixel electrode 710, and a common electrode 730 formed on the organic emission layer 720. Herein, the pixel electrode 710 is referred to as a positive (+) electrode (hole injection electrode), and the common electrode 730 is referred to as a negative (−) electrode (electron injection electrode). However, the present invention is not limited thereto. Therefore, the pixel electrode 710 may be a negative electrode, and the common electrode 730 may be a positive electrode, according to a driving method of the organic light emitting diode display 100. Holes and electrodes are injected into the organic emission layer 720, from the pixel electrode 710 and the common electrode 730. Light is produced when excitons, generated by the combination of holes and electrons in the organic emission layer, transit from an excited state to a ground state.

In the organic light emitting element 70, light from the organic emission layer 720 is radiated away from the pixel electrode 710, that is, in the direction of the common electrode 730, to display images. That is, the organic light emitting diode display 100 is a top emission-type.

The storage capacitor 80 includes a first storage plate 158, a second storage plate 178, and a gate insulating layer 140 interposed therebetween. The gate insulating layer 140 can be referred to as a dielectric material. Storage capacity is determined by the amount of electric charge stored in the storage capacitor 80 and a voltage difference between the storage plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 serves as a switching element that selects a desired light emitting pixel. The switching gate electrode 152 is connected to the gate line 151. The switching source electrode 173 is connected to the data line 171. The switching drain electrode 174 is disposed opposite to the switching source electrode 173 and is connected to the first storage plate 158.

The driving thin film transistor 20 applies a driving voltage to the organic light emitting element 70, which is applied to the organic emission layer 720 to produce light. The driving gate electrode 155 is connected to the first storage plate 158. The driving source electrode 176 and the second storage plate 178 are each connected to the common power supply line 172. The driving drain electrode 177 is connected to the pixel electrode 710, through a contact hole 182.

The switching thin film transistor 10 is actuated by a gate voltage applied to the gate line 151, to transmit data voltage applied to the data line 171, to the driving thin film transistor 20. A voltage corresponding to a difference between a common voltage, which is applied to the driving thin film transistor 20 from the common power supply line 172, and a data voltage, which is transmitted from the switching thin film transistor 10, is stored in the storage capacitor 80. A current corresponding to the voltage stored in the storage capacitor 80 flows to the organic light emitting element 70, through the driving thin film transistor 20, such that the organic light emitting element 70 emits light.

The organic light emitting diode display 100 further includes a pixel defining layer 190, color filters 310, and spacers 192. The pixel defining layer 190 has openings 199 exposing the pixel electrodes 710, and defines emission regions and a non-emission region of the organic light emitting element 70. In each opening 199, the organic emission layer 720, and the common electrode 730 are sequentially laminated, such that the organic emission layer 720 emits light. That is, the pixel defining layer 190 substantially forms the non-emission region, and the openings 199 substantially form the emission regions.

The color filters 310 are formed on the common electrode 730, in the openings 199 of the pixel defining layer 190. In the organic light emitting diode display 100, each organic emission layer 720 emits light that is the same color as the color filter 310 formed thereon. For example, a red color filter 310 can be disposed in an opening 199 having a red light emitting organic emission layer 720. However, the present invention is not limited thereto. For example, the organic emission layers 720 may emit white light, and the color filters 310 may filter the white light to produce other colors.

The color filter 310 effectively suppresses ambient light from being reflected by the pixel electrode 710 and/or the common electrode 730. Therefore, the mount of light emitted from the organic light emitting element 70, to the outside, can be maximized.

The spacers 192 serve to separate the display substrate 110 and the sealing member 210. Further, the spacers 192 also serve to suppress the ambient light reflection, by dispersing the ambient light reflected by a conductive layer disposed below the spacer 192. Herein, the conductive layer may include the gate line 151, the data line 171, and the common power supply line 172.

The pixel defining layer 190 and the spacers 192 may be integrally formed, through a photography process or a photolithography process, by using a photosensitive material. That is, both the pixel defining layer 190 and the spacers 192 may be formed using a half-tone exposure process. However, the present invention is not limited thereto. For example, the pixel defining layer 190 and the spacers 192 may be formed sequentially or separately and may be made of different materials.

The spacers 192 may have portions that are shaped as a truncated pyramid, a prism, a truncated circular cone, a cylinder, a hemisphere, or a semi-oblate sphere. In addition, the spacers 192 may be uniformly or non-uniformly distributed on the pixel defining layer 190.

Each pixel includes a pixel electrode 710, a color filter 310, and an opening 199 of the pixel defining layer 190. Therefore, the organic light emitting diode display 100 includes a plurality of the pixel electrodes 710, a plurality of the color filters 310, and a plurality of the openings 199. Further, a plurality of spacers 192 are also formed around each pixel. As the number of the spacers 192 increases, a light dispersion effect can be increased.

The sealing member 210 is disposed opposite to the display substrate 110, covering the thin film transistors 10 and 20, the storage capacitor 80, and the organic light emitting element 70, to seal them from the outside. The sealing member 210 includes a second substrate member 211. In addition, although not shown, the display substrate 110 and the sealing member 210 are sealed together, by a sealant disposed on edges of the display substrate 110 and the sealing member 210.

The organic light emitting diode display 100 can effectively suppress visibility and contrast reductions, due to the external light reflection. Further, the organic light emitting diode display 100 can minimize the loss of light generated by the organic light emitting element 70, and emitted to the outside.

The organic light emitting diode display 100 may omit a polarizing member, which is generally used to suppress ambient light reflection, due to the configuration of the color filters 310 and the spacers 192. Therefore, it is possible to improve the emission efficiency of the organic light emitting diode display 100, as compared to when a polarizing member is used. That is, the organic light emitting diode display 100 has improved luminance and lifespan.

Hereinafter, the lamination sequence of the organic light emitting diode display 100 will be described in detail. Further, a structure of the thin film transistors will now be described. In addition, only differences between the switching thin film transistor 10 and the driving thin film transistor are described in detail.

The first substrate member 111 is formed from an insulating substrate that is made of glass, quartz, ceramic, plastic, of the like. However, the present invention is not limited thereto. Accordingly, the first substrate member 111 may be formed from a metallic substrate that is made of stainless steel, of the like.

A buffer layer 120 is formed on the first substrate member 111. The buffer layer 120 serves to prevent the diffusion of impurities and provides a planarized surface. The buffer layer 120 may be made of various materials, for example, a SiNx film, a SiOx film, or a SiOxNy film. However, the buffer layer 120 is optional and may be omitted, depending on the type and processing conditions of the first substrate member 111.

The driving semiconductor layer 132 is formed on the buffer layer 120. The driving semiconductor layer 132 is generally a polycrystal silicon film. The driving semiconductor layer 132 includes a channel region 135 where no impurity is doped, and source and drain regions 136 and 137 where an impurity is doped, which are disposed on opposing sides of the channel region 135. The doped impurity may be a P-type impurity, such as boron (B), or $B_2H_6$. Herein, the type of impurity depends on the type of thin film transistor.

In the first exemplary embodiment of the present invention, a PMOS-structure thin film transistor, using the P-type impurity is used as the driving thin film transistor 20, but the driving thin film transistor is not limited thereto. Therefore, an NMOS-structure thin film transistor, or a CMOS-structure thin film transistor, may be used as the driving thin film transistor 20.

The driving thin film transistor 20 shown in FIG. 2 is a polycrystalline thin film transistor including a polycrystalline silicon film. The switching thin film transistor 10 shown in FIG. 1 may be a polycrystalline thin film transistor, or an amorphous thin film transistor including an amorphous silicon film.

The gate insulating layer is formed on the driving semiconductor layer 132. A gate wire including the driving gate electrode 155 is formed on the gate insulating layer 140. The gate wire further includes the gate line 151, the first storage plate 158, and other wires. The driving gate electrode 155 is overlaps with at least part of the driving semiconductor layer 132, and in particular, the channel region 135.

An interlayer insulating layer 160 is formed on the gate insulating layer 140, so as to cover the driving gate electrode 155. The gate insulating layer 140 and the interlayer insulating layer 160 have through-holes that are aligned to expose the source region 136 and the drain region 137 of the driving semiconductor layer 132. The interlayer insulating layer 160 is made of silicon nitride (SiNx) or silicon oxide (SiOx), like the gate insulating layer 140.

Data wires, including the driving source electrode 176 and the driving drain electrode 177, are formed on the interlayer insulating layer 160. The data wires further include the data line 171, the common power supply line 172, the second storage plate 178, and other wires. The driving source electrode 176 and the driving drain electrode 177 are connected to the source region 136 and the drain region 137, respectively, through the through-holes formed of the interlayer insulating layer 160 and the gate insulating layer 140, respectively.

As such, a driving thin film transistor 20 is formed that includes the driving semiconductor layer 132, the driving gate electrode 155, the driving source electrode 176, and the driving drain electrode 177. The configuration of the driving thin film transistor 20 is not limited to the above-mentioned example, and may be modified in various known configurations.

A planarization layer 180 covering the data wires is formed on the interlayer insulating layer 160. The planarization layer 180 serves to planarize the data wires, in order to increase luminous efficiency of the organic light emitting element 70, which is formed thereon. Further, the planarization layer 180 has the contact hole 182 exposing the drain electrode 177. The planarization layer 180 may be made of at least one material among a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The first exemplary embodiment of the present invention is not limited to the above-mentioned configuration. In particular, any one of the planarization layer 180 and the interlayer insulating layer 160 may be omitted.

The pixel electrodes 710 are formed on the planarization layer 180. That is, the pixel electrodes 710 are each disposed in respective ones of the pixels. The pixel electrodes 710 are separated from each other. Each pixel electrode 710 is connected to a drain electrode 177, through the contact holes 182 of the planarization layer 180.

The pixel defining layer 190 is formed on the planarization layer 180. The openings 199 of the pixel defining layer 190 are formed around each pixel. The pixel electrodes 710 are disposed in the openings 199. However, the pixel electrodes 710 are not necessarily disposed only in the openings 199 of the pixel defining layer 190, as the pixel electrodes 710 may be disposed below the pixel defining layer 190, so that the pixel electrodes 710 overlap the pixel defining layer 190. Where the pixel defining layer 190 is disposed substantially forms the non-emission region, and the openings 199 substantially form the emission regions.

The spacers 192 are formed on the pixel defining layer 190. That is, the spacers 192 are formed in the non-emission region. The spacers 192 serve to separate the display substrate 110 and the sealing member 210. The spacers 192 also serve to suppress the ambient light reflection, by dispersing the ambient light reflected by a conductive layer disposed below the spacer 192. Herein, the conductive layer may include the gate line 151, the data line 171, and the common power supply line 172.

The pixel defining layer 190 and the spacers 192 may be made formed from a polyacrylate resin, a polyamide-based resin, or silica-based inorganic materials. The pixel defining layer 190 and the spacers 192 may be integrally formed, through the photography process or the photolithography process. That is, both the pixel defining layer 190 and the spacers 192 may be formed by the half-tone exposure process. However, the first exemplary embodiment of the present invention is not limited thereto. Therefore, the pixel defining layer 190 and the spacers 192 may be formed sequentially, or separately, and may be made of different materials.

The organic emission layer 720 is formed on the pixel electrode 710 and the common electrode 730 is formed on the organic emission layer 720. As such, an organic light emitting element 70 is formed that includes the pixel electrode 710, the organic emission layer 720, and the common electrode 730. At this time, the organic emission layer 720 is disposed between the pixel electrode 710 and the common electrode 730, in the opening 199 of the pixel defining layer 190. Further, the common electrode 730 covers the organic emission layer 720, the pixel defining layer 190, and the spacer 192.

The organic emission layer 720 can be formed from a low molecular weight organic material or a high molecular weight organic material. The organic emission layer 720 may be formed as a laminate structure, including at least one of an emission layer, a hole-injection layer (HIL), a hole-transporting layer (HTL), an electron-transporting layer (ETL), and an electron-injection layer (EIL). The hole-injection layer is disposed on the pixel electrode 710, and then the hole-transporting layer, the emission layer, the electron-transporting layer, and the electron-injection layer are laminated in sequence.

In FIG. 2, the organic emission layer 720 is disposed only in the opening 199, but the present invention is not limited thereto. Accordingly, the organic emission layer 720 may be formed on the pixel electrode 190, in the opening 199, or may be disposed between the pixel defining layer 190 and the common electrode 730. More specifically, the hole-injection layer (HIL), the hole-transporting layer (HTL), the electron-transporting layer (ETL), and the electron-injection layer (EIL), the hole-injection layer (HIL), the hole-transporting layer (HTL), the electron-transporting layer (ETL), and the electron-injection layer (EIL) may be formed on the pixel electrode 710 and in the pixel defining layer 190, by using an open mask manufacturing process. That is, at least one of various layers included in the organic emission layer 720 may be disposed between the pixel defining layer 190 and the common electrode 730.

The pixel electrode 710 and the common electrode 730 may be made of a transparent conductive material, or a semi-transparent or reflective conductive material. The organic light emitting diode display 100 may be a top emission type, a bottom emission type, or a dual surface emission type, according to the materials of the pixel electrode 710 and the common electrode 730.

The organic light emitting diode display 100 is formed as the top emission type. That is, the organic light emitting element 70 emits light toward the sealing member 210, through the color filter 310, to display images.

Materials such as indium tin oxide (ITO), indium zinc oxide (IZO), zinc oxide (ZnO), or indium oxide ($In_2O_3$) may be used as the transparent conductive material. Materials such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material or the semi-transparent material.

The color filters 310 are formed on the common electrode 730, in the openings 199 of the pixel defining layer 190. The organic emission layers 720 can emit light of the same color as the color filter 310 disposed thereon. For example, a red color filter 310 and a red organic emission layer 720 can be formed in the same opening 199.

However, the present invention is not limited thereto. Accordingly, the organic emission layers 720 may emit white light, and the associated color filters 310 may filter the white light into other colors.

The color filters 310 effectively suppress ambient light from being reflected by the pixel electrodes 710 or the common electrode 730. Therefore, loss of light emitted from the organic light emitting elements 70, to the outside, can be minimized.

The sealing member 210 is disposed facing the common electrode 730 and the color filters 310. The second substrate member 211 is made of a transparent material, such as glass, plastic, of the like. In addition, although not shown, a sealant is disposed on edges of the display substrate 110 and the sealing member 210, such that the display substrate 110 and the sealing member 210 are sealed and bonded together.

The organic light emitting diode display 100 has improved visibility. More specifically, the color filters 310 suppress the ambient light reflection in the emission regions, and the spacers 192 suppress the ambient light reflection in the non-emission regions. Accordingly, the organic light emitting diode display 100 can have excellent visibility and contrast, by limiting the ambient light reflection. The organic light emitting diode display 100 also has excellent luminous efficiency.

Figure 3:
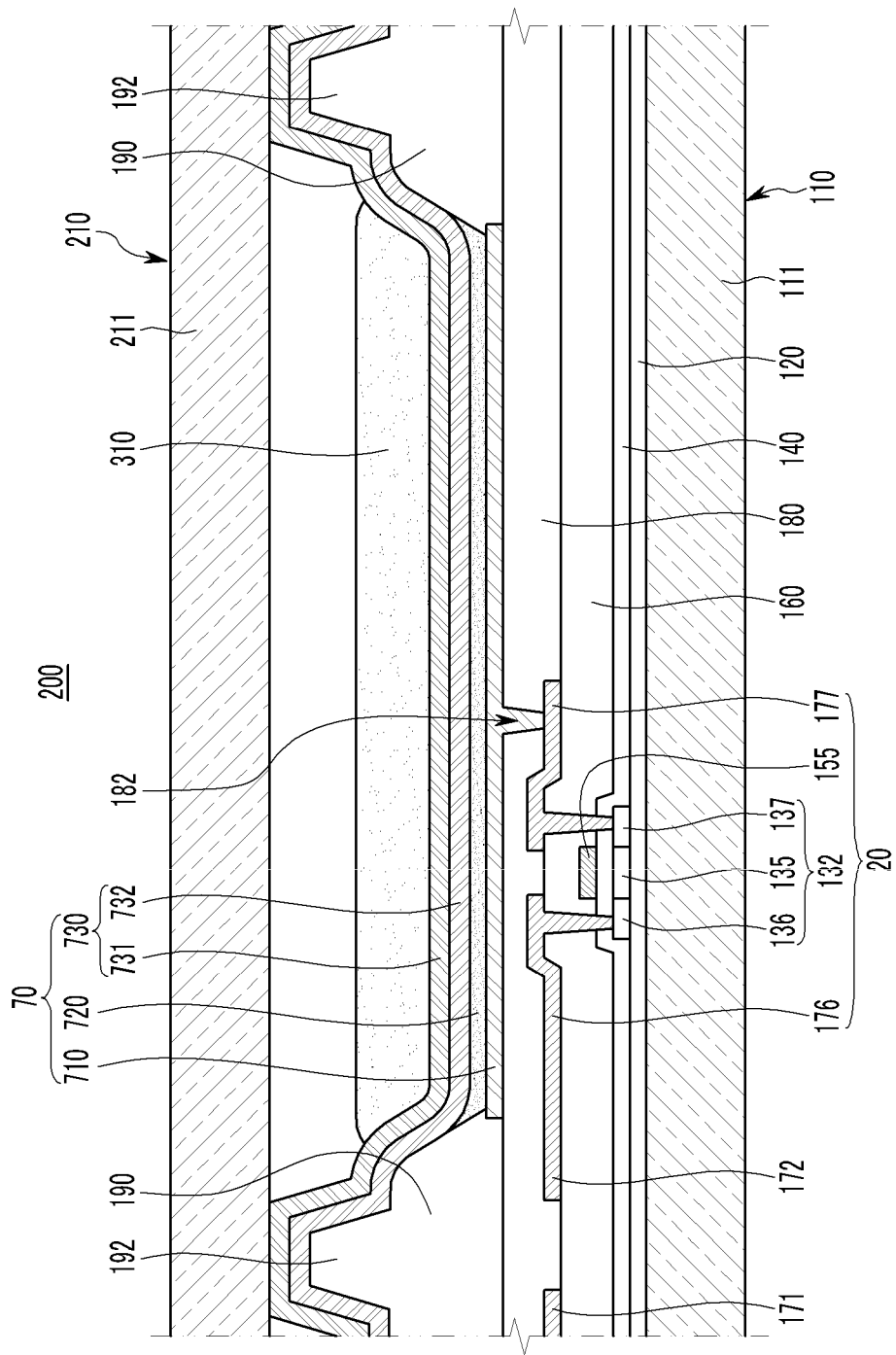
FIG. 3 is a cross-sectional view of an organic light emitting diode display, according to a second exemplary embodiment of the present invention.

FIG. 3 illustrates an organic light emitting diode display 200, according to a second exemplary embodiment of the present invention. As shown in FIG. 3, the organic light emitting diode display 200 includes an organic light emitting element 70 having a common electrode 730. The common electrode has a laminate structure. In particular, the common electrode 730 includes a first metal layer 731 and a second metal layer 732.

The first metal layer 731 and the second metal layer 732 can each include at least one metal selected from magnesium (Mg), silver (Ag), calcium (Ca), lithium (Li), chromium (Cr), and aluminum (Al). For example, the first metal layer 731 can include silver (Ag), and the second metal layer 732 can include at least one of an alloy of magnesium and silver (Mg:Ag), aluminum (Al), calcium (Ca), lithium (Li), and chromium (Cr).

As such, the common electrode 730 has a low surface resistance and reflectance. That is, the organic light emitting diode display 200 has improved electrical conductivity, while suppressing ambient light reflection, so as to improve electrical efficiency.

Accordingly, the organic light emitting diode display 200 has improved visibility and contrast, due to the suppression of the ambient light reflection by the color filters 310, the spacers 192, and the common electrode 730. Further, the organic light emitting diode display 200 has improved luminance, lifespan, and luminous efficiency.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode display, comprising:
    a substrate;
    a sealing member;
    pixel electrodes disposed on the substrate between the sealing member and the substrate;
    a pixel defining layer disposed on the substrate, having openings to expose the pixel electrodes;
    spacers disposed between the pixel defining layer and the sealing member to separate the sealing member from the pixel defining layer and to disperse reflected ambient light;
    organic emission layers disposed on the pixel electrodes;
    a common electrode disposed on the organic emission layers and the spacers, wherein an entire top surface of the common electrode on a top surface of the spacer contacts the sealing member; and
    color filters disposed on and contacting the common electrode in the openings of the pixel defining layer, and separated from the sealing member.

2. The organic light emitting diode display of claim 1, wherein in each of the openings, the corresponding organic emission layer emits a color of light that is not absorbed by the corresponding color filter.

3. The organic light emitting diode display of claim 1, wherein the organic emission layers emit white light.

4. The organic light emitting diode display of claim 1, wherein the spacers have at least one portion that has a shape selected from a truncated pyramid, a prism, a truncated circular cone, a cylinder, a hemisphere, and a semi-oblate sphere.

5. The organic light emitting diode display of claim 1, wherein the spacers maintain a space between the substrate and the sealing member.

6. The organic light emitting diode display of claim 1, wherein the spacers and the pixel defining layer are integrally formed, using the same material and process.

7. The organic light emitting diode display of claim 1, wherein:
    the common electrode comprises a first metal layer and a second metal layer disposed directly on the first layer; and
    the first metal layer and the second metal layer each comprise at least one metal independently selected from magnesium (Mg), silver (Ag), calcium (Ca), lithium (Li), chromium (Cr), and aluminum (Al).

8. The organic light emitting diode display of claim 7, wherein:
    the first metal layer comprises silver (Ag); and
    the second metal layer comprises at least one selected from an alloy of magnesium and silver (Mg:Ag), aluminum (Al), calcium (Ca), lithium (Li), and chromium (Cr).

9. An organic light emitting diode display, comprising:
    a substrate;
    a sealing member;
    pixel electrodes disposed on the substrate between the substrate and the sealing member;
    a pixel defining layer disposed on the substrate, having openings to expose the pixel electrodes;
    spacers disposed between the pixel defining layer and the sealing member to separate the sealing member from the pixel defining layer and to disperse reflected ambient light;
    organic emission layers disposed on the pixel electrodes;
    a common electrode disposed on the organic emission layers and the spacers, wherein an entire top surface of the common electrode on a top surface of the spacer contacts the sealing member, comprising,
        a first layer comprising silver (Ag), and
        a second layer comprising at least one selected from an alloy of magnesium and silver (Mg:Ag), aluminum (Al), calcium (Ca), lithium (Li), and chromium (Cr); and
    color filters formed on and contacting the common electrode in the openings of the pixel defining layer, and separated from the sealing member.

10. The organic light emitting diode display of claim 9, wherein the first layer is disposed directly on the second layer, and the second layer is disposed directly on the emission layers.

11. The organic light emitting diode display of claim 9, wherein in each of the openings, the corresponding organic emission layer emits a color of light that is not absorbed by the corresponding color filter.

12. The organic light emitting diode display of claim 9, wherein the spacers each have at least one portion that has a shape selected from a truncated pyramid, a prism, a truncated circular cone, a cylinder, a hemisphere, and a semi-oblate sphere.

13. The organic light emitting diode display of claim 9, wherein the organic emission layers emit white light.

14. The organic light emitting diode display of claim 1, further comprising a planarization layer disposed on the substrate,
    wherein the pixel electrodes and the pixel defining layer are both disposed directly on the planarization layer.

15. The organic light emitting diode display of claim 14, further comprising:
    a buffer layer disposed directly on the substrate;
    a gate insulating layer disposed directly on the buffer layer, and
    an interlayer insulating layer disposed directly on the gate insulating layer,
    wherein the planarization layer is disposed directly on the interlayer insulating layer.

16. The organic light emitting diode display of claim 1, wherein the common electrode comprises:
    a first portion between the color filters and the pixel defining layer; and
    a second portion between the organic emission layers and the sealing member,
    wherein the first portion of the common electrode is closer to the sealing member than the second portion.

17. The organic light emitting diode display of claim 7, wherein the second metal layer covers substantially all of a surface of the first metal layer facing the sealing member.

18. The organic light emitting diode display of claim 1, wherein the spacers being configured to maintain a gap between the substrate and the sealing member by holding the common electrode against the sealing member.

19. The organic light emitting diode display of claim 9, wherein the spacers being configured to maintain a gap between the substrate and the sealing member by holding the common electrode against the sealing member.

* * * * *